(12) United States Patent
Ferriss et al.

(10) Patent No.: US 12,738,899 B2
(45) Date of Patent: Sep. 15, 2026

(54) TRANSCONDUCTOR WITH CURRENT LIMITER

(71) Applicant: Nokia Solutions and Networks Oy, Espoo (FI)

(72) Inventors: Mark Ferriss, Tarrytown, NY (US); Lorenzo Iotti, Brooklyn, NY (US); Alexander Rylyakov, Staten Island, NY (US)

(73) Assignee: Nokia Solutions and Networks Oy, Espoo (FI)

( * ) Notice: Subject to any disclaimer, the term of this patent is extended or adjusted under 35 U.S.C. 154(b) by 566 days.

(21) Appl. No.: 18/356,576

(22) Filed: Jul. 21, 2023

(65) Prior Publication Data

US 2024/0195364 A1 Jun. 13, 2024

Related U.S. Application Data

(60) Provisional application No. 63/431,927, filed on Dec. 12, 2022.

(51) Int. Cl.
*H03F 1/52* (2006.01)
*H03F 3/45* (2006.01)

(52) U.S. Cl.
CPC .......... *H03F 1/52* (2013.01); *H03F 3/45475* (2013.01); *H03F 2200/426* (2013.01)

(58) Field of Classification Search
USPC .................................. 330/252, 59, 261, 308
See application file for complete search history.

(56) References Cited

U.S. PATENT DOCUMENTS

| | | | | |
|---|---|---|---|---|
| 6,084,472 | A | 7/2000 | Gilbert | |
| 7,876,153 | B1 * | 1/2011 | Zeller | H03F 3/45085 330/252 |
| 9,306,541 | B2 * | 4/2016 | Suzuki | H03F 3/45085 |
| 2005/0195870 | A1 * | 9/2005 | Moran | H04B 15/02 372/38.02 |

FOREIGN PATENT DOCUMENTS

| | | | | |
|---|---|---|---|---|
| EP | 2112727 | A1 * | 10/2009 | H03K 17/16 |
| WO | 2020174628 | A1 | 9/2020 | |

OTHER PUBLICATIONS

Galal, Razavi, "Broadband ESD protection circuits in CMOS technology", JSSC 2003.

(Continued)

*Primary Examiner* — John W Poos
*Assistant Examiner* — Natasha Y Marano
(74) *Attorney, Agent, or Firm* — Stratford Group Ltd.

(57) ABSTRACT

An apparatus, such as a coherent optical receiver, includes a transimpedance amplifier (TIA) with differential outputs, and a multi-tanh type current limiter connected across the differential outputs of the transimpedance amplifier. The multi-tanh type current limiter includes two tanh-type current limiters shifted in voltage and connected to subtract an output current thereof from an output current of the TIA.

8 Claims, 5 Drawing Sheets

(56) References Cited

OTHER PUBLICATIONS

Ahmed Mostafa G et al. "34-GBd Linear Transimpedance Amplifier for 200-GB/s DP-16-QAM Optical Coherent Receivers"; IEEE Journal of Solid-State Circuits, IEEE, USA, vol. 54, No. 3, Feb. 21, 2019, pp. 834-844, XP011711319, ISSN: 0018-9200, DOI: 10.1109/JSSC.2018.2882265, p. 834, left-hand column, line 11; figures 1-19.
Mesgari B et al. "A Single-to-Differential Transimpedance Amplifier for Low-Noise and High-Speed Optical Receivers", 2019 Austrochip Workshop on Microelectronics (austrichip0, IEEE, Oct. 24, 2019, pp. 76-80, XP033661774, DOI: 10.1109/Austrochip. 2019.00025 p. 76 left hand column, line 19—p. 79, right-hand column, line 6; figures 1-10.

* cited by examiner

TRANSCONDUCTOR WITH CURRENT LIMITER

CROSS-REFERENCE TO RELATED APPLICATIONS

This application claims the benefit of U.S. Provisional Patent Application No. 63/431,927, filed on Dec. 12, 2022, which is incorporated herein by reference in its entirety.

FIELD OF INVENTION

Various example embodiments relate to circuits for trans-impedance amplifiers and coherent optical receivers with trans-impedance amplifiers.

BACKGROUND

Transimpedance amplifiers (TIAs) are used in high speed fiber optic communication systems to provide a link between optical-to-electrical converters, e.g. photodetectors (PD), and the downstream electronics. A TIA converts the current coming from the PD into a voltage, thus providing transimpedance gain (ZT). This voltage is typically fed to an ADC, and the resulting signal may be processed in the digital domain. The TIA is desirably linear, and has a well-controlled gain in the relevant operating range, so that the ADC receives a voltage that is an about linear representation of the current from the PD, and has a magnitude within the dynamic range of the ADC.

SUMMARY

The present disclosure provides an apparatus including a limiter of an output current. First embodiments of the apparatus comprise a transimpedance amplifier (TIA) with differential outputs, and a multi-tanh type current limiter connected across the differential outputs of the TIA.

In any of the first embodiments, the multi-tanh type current limiter may comprise first and second tanh-type current limiters connected to subtract an output current thereof from an output current of the TIA. The first and second tanh-type current limiters are biased to be shifted in voltage.

In any of the first embodiments, the first and second tanh-type current limiters may be biased to be shifted by a voltage approximately being a voltage range for linear amplification by the TIA.

In any of the first embodiments, the multi-tanh type current limiter may comprise a multi-tanh doublet. The multi-tanh type current limiter may, in some of such first embodiments, comprise two non-degenerated transistor pairs.

In any of the first embodiments, the TIA may include a degenerated transistor pair at an output thereof. A peak transconductance of each of the first and second tanh-type current limiters may be, in some of such first embodiments, at least double in magnitude a peak transconductance of the degenerated transistor pair.

In any of the first embodiments, the first and second tanh-type current limiters may be biased to have threshold voltages of opposite sign. In some of such first embodiments, the apparatus may further comprise a threshold control circuit for controlling the threshold voltages. In some of such first embodiments, the threshold control circuit may comprise: a first resistor $R_{drop}$ for passing a first current $I_1$ therethrough, a voltage drop $\Delta V_d = I_1 * R_{drop}$ across the first resistor biasing one of the first and second tanh-type current limiters to have a threshold voltage equal to $\Delta V_d$; a transistor for tuning the first current $I_1$; a voltage feedback circuit comprising a second resistor $R_x \geq 10 \cdot R_{drop}$ in parallel with the first resistor; and a reference current source for flowing a reference current $I_{ref}$ through the second resistor $R_x$. The voltage feedback circuit may further comprise an operational amplifier coupled to the transistor for adjusting the first current $I_1$ to force the voltage drop across the first resistor $R_{drop}$ to be equal to approximately $R_x \cdot I_{ref}$. In some of such first embodiments, the threshold control circuit may comprise: a resistor $R_{drop}$ having first and second terminals connected to positive and negative inputs, respectively, of the first and second tanh-type current limiters; a first current source comprising a transistor and connected to the second terminal of the resistor $R_{drop}$ to flow a first current $I_1$ therethrough, so that a voltage drop $\Delta V_d = I_1 * R_{drop}$ across the resistor $R_{drop}$ provides one of the threshold voltages for turning on the corresponding one of first and second tanh-type current limiters; a resistor $R_x$ having a first terminal connected to the first terminal of $R_{drop}$, and a second terminal connected to a second current source for generating a reference current $I_{ref}$, wherein $R_x \geq 10 \cdot R_{drop}$; an operational amplifier having an output connected to a base or gate of the transistor of the first current source, and inputs connected to the second terminals of the resistors $R_x$ and $R_{drop}$, so as to set $\Delta V_d$ approximately equal in magnitude to $I_{ref} * R_x$.

In any of the first embodiments, the first and second tanh-type current limiters may be biased to have I-V characteristics shifted relative to each other by a voltage offset approximately being a voltage range for linear amplification by the transimpedance amplifier.

In any of the first embodiments, the apparatus may comprise a coherent optical receiver including the TIA.

Second embodiments of the apparatus comprise a limiting amplifier operable to convert a differential input voltage $V_{in}$ to a differential output current. The limiting amplifier comprises a first circuit having a substantially non-zero first trans-conductance $T_{c1}$ for $|V_{in}| \leq V_1$, and a limiter circuit having a second trans-conductance $T_{c2}$, wherein $T_{c2}$ is smaller in magnitude than $T_{c1}$ for $|V_{in}| \leq V_2 < V_1$, and $T_{c2}$ is greater in magnitude than $T_{c1}$ in some range of $|V_{in}|$ above $V_2$. The limiter circuit is connected so that an output current of the limiter circuit is subtracted from an output current of the first circuit.

In any of the second embodiments, the first circuit may comprise an emitter-degenerated or source-degenerated transistor pair.

In any of the second embodiments, the limiter circuit may comprise two non-degenerated transistor pairs connected to have two DC voltage offsets of opposite sign.

In any of the second embodiments, the limiter circuit may comprise a multi-tanh doublet. In some of such second embodiments, the multi-tanh doublet may comprise two non-degenerated transistor pairs connected to have two DC voltage offsets of opposite sign.

In any of the second embodiments, the apparatus may comprise a coherent optical receiver including the limiting amplifier.

BRIEF DESCRIPTION OF THE DRAWINGS

Embodiments disclosed herein will be described in greater detail with reference to the accompanying drawings which represent preferred embodiments thereof, in which like elements are indicated with like reference numerals, and wherein.

DETAILED DESCRIPTION

In the following description, for purposes of explanation and not limitation, specific details are set forth, such as particular circuits, circuit components, techniques, etc. in order to provide a thorough understanding of the present invention. However, it will be apparent to one skilled in the art that the present invention may be practiced in other embodiments that depart from these specific details. In other instances, detailed descriptions of well-known methods, devices, and circuits may be omitted so as not to obscure the description of the present invention. All statements herein reciting principles, aspects, and embodiments of the invention, as well as specific examples thereof, are intended to encompass both structural and functional equivalents thereof. Additionally, it is intended that such equivalents include both currently known equivalents as well as equivalents developed in the future, i.e., any elements developed that perform the same function, regardless of structure.

Figure 1:
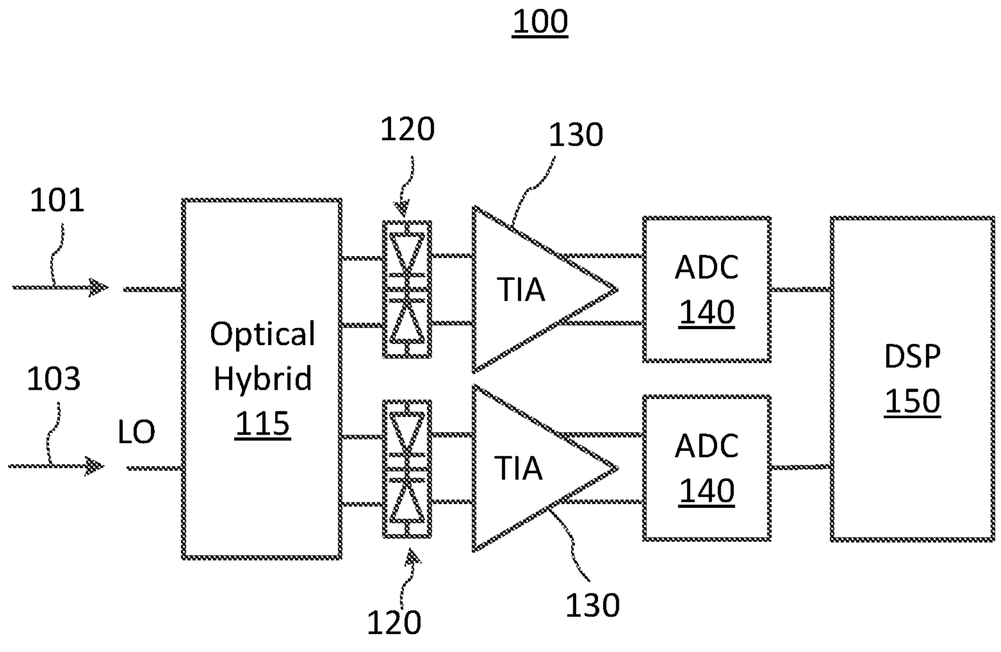
FIG. 1 is a schematic block diagram of a coherent optical receiver where the TIA(s) of the present disclosure may be used.

Furthermore, the following abbreviations and acronyms may be used in the present document:

ADC: Analog to Digital Converter
AGC: Automatic Gain Control
ASIC: Application Specific Integrated Circuit
AV: voltage gain
CMOS: Complementary Metal-Oxide-Semiconductor
DSP: Digital Signal Processor
PVT: Process/supply Voltage/Temperature
RF: Feedback Resistor
TIA: TransImpedance Amplifier
VGA: Variable Gain Amplifier
ZT: transimpedance FIG. 1 illustrates a block diagram of an example coherent optical receiver 100 of some embodiments of the present disclosure. An optical signal 101 received from an optical communication link (not shown) is mixed with local oscillator (LO) light 103 in an optical hybrid 115. Different mixtures of the optical signal 101 and LO light 103 from four output ports of the optical hybrid 115 are transmitted to two photodiode (PD) pairs 120. Each PD pair 120 may be suitably biased. The two PDs of a pair measure mixtures of the received optical signal light 101 with LO light 103 with different relative phase shifts. The signals from the two PDs of a pair are coupled to the differential inputs of a corresponding TIA circuit 130. Differential outputs of the TIAs 130 are provided to respective ADCs 140, which are, in turn, connected to a DSP 150 for signal processing and data de-modulation.

Figure 2:
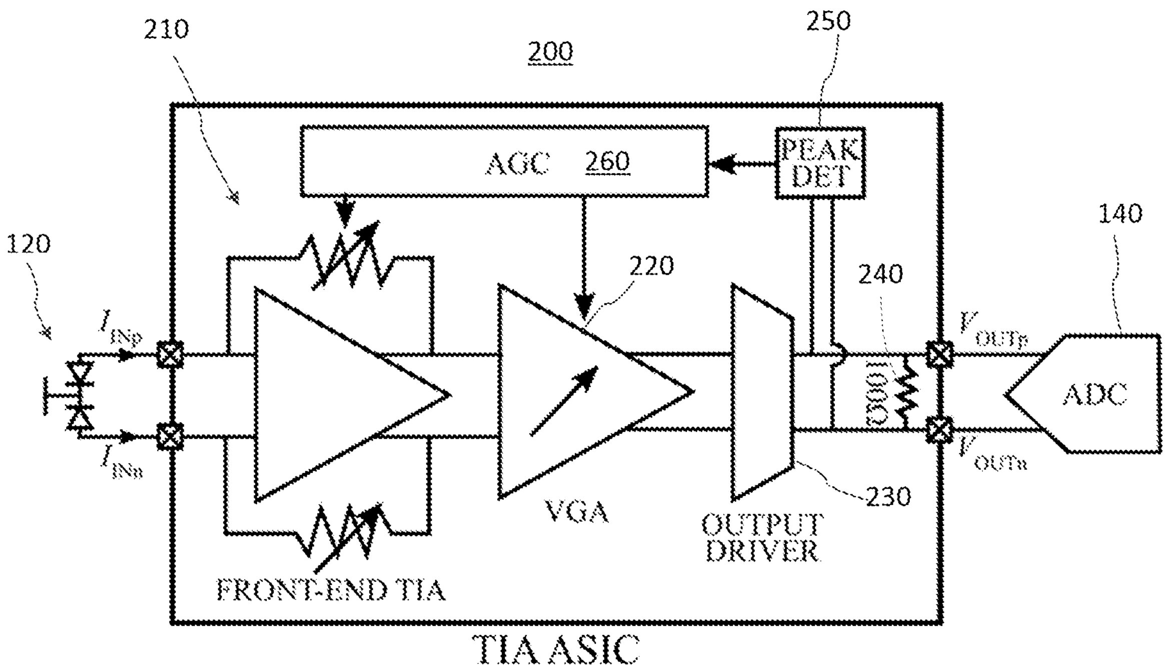
FIG. 2 is a schematic block diagram of a TIA circuit that may be used in the coherent optical receiver of FIG. 1.

A block diagram of a typical TIA circuit 200 ("TIA 200"), which may be implemented e.g. as an Application-Specific Integrated Circuit (ASIC), is shown in FIG. 2. It includes a front-end TIA (FE-TIA) 210, which converts the PD current(s) $I_{INp}$, $I_{INn}$ into a voltage signal, followed by a series of one or more Variable Gain Amplifiers (VGA) 220 to provide further voltage amplification, and an output driver 230. The output driver 230 is typically a transconductor, which drives an on-chip termination resistor 240 as well as being connected to the inputs of the ADC 140. The TIA circuit 200 may also include a peak detector 250 to measure the output swing, and an Automatic Gain Control (AGC) loop 260, which adjusts the TIA gain in order to keep the peak output swing at a desired value in the presence of slow variations of the swing of the currents $I_{INp}$, $I_{INn}$ input to the TIA 200.

For the coherent optical receiver 100 illustrated in FIG. 1, the TIA input signal amplitude can vary suddenly by >10× (20 dB) due to events in the optical network. Such events can substantially change the optical signal propagating to an optical receiver, at a rate much lower than the baud rate or symbol rate of the optical signal 101. In response to such events, gain of the TIA circuit 200 may be adjusted by the AGC 260, so that the amplitude of the output signal remains about constant and remains within a desirable operating range of the ADC 140 connected to receive the output signals $V_{OUTp}$, $V_{OUTn}$ of the TIA circuit 200.

As the speed of data links increase, the ADC bandwidth also increases. Increasing the ADC bandwidth typically necessitates the use of small feature size transistors, which may be very sensitive to over-voltage stresses, and can be easily damaged if the output voltage of the TIA is too large. Therefore it is of importance that the TIA does not produce output voltage signals of a magnitude that exceed an ADC threshold.

One way to limit swing in a fast and reliable way is to use a diode clamp, commonly used to prevent damage to I/O circuits in case of electrostatic discharge (ESD) events. Below a threshold voltage, the diode acts as a high impedance, and has negligible impact on the signal swing. Above the threshold the diode acts as a low impedance, effectively clamping the maximum swing to the threshold voltage. By properly biasing the diode, the clamping voltage can be set to a desired value.

There are typically two main problems related to implementing a diode clamp in a high-speed linear TIA. The first is that diodes add significant parasitic capacitance, which can significantly worsen the TIA bandwidth and high-frequency output reflection coefficient ($S_{22}$). Some techniques have been proposed to avoid these drawbacks, but the techniques typically employ resonant circuits that occupy significant area and add design complexity.

Another issue is that approaching the diode threshold voltage, there is a voltage region of ~200 mV where the diode is not clamping the swing yet, but starts to behave as a nonlinear impedance. Operating the diode in this region has an undesired effect on the TIA harmonic distortion.

On the other hand, operating below but close to the maximum allowed swing is a desired feature in TIAs: this ensures that the ADC full-scale range is fully utilized, which reduces the impact of the ADC quantization noise.

Embodiments of circuits capable of operating linearly up to a certain threshold, and abruptly clamping the voltage above the threshold, may be useful, e.g., in the output driver 230 of the TIA circuit 200 illustrated in FIG. 2.

Some embodiments described herein may utilize a multi-tanh type current limiter. Multi-tanh transconductors employ multiple differential transistor pairs connected in parallel, each biased with a tail current $I_j$, j=1, 2, . . . being an index of the pair. Each differential transistor pair has a different DC offset $V_j$, so that the differential transistor pair is balanced (i.e. the "positive" and "negative" currents are about equal) for $V_{in}=V_j$, where $V_{in}$ is an input voltage. Properly choosing currents $I_j$ and offsets $V_j$ can produce a transconductor with a superior input linear range. Embodiments described herein modify this concept to provide a multi-tanh like current limiter to achieve current clamping, e.g., abrupt current limiting. Herein, a multi-tanh type current limiter refers to a circuit that has differential current output approximately given by a combination of multiple, typically two, rounded step-functions of input voltages ("tanh-like" functions), with transition regions of the rounded step functions being shifted in voltage relative to each other. The voltage shift between the transition regions is selected. e.g. by suitably biasing corresponding sub-circuits with the "tanh-like" I-V characteristics, to limit ("clamp") the output current when the input voltage shifts outside a voltage range of TIA linear operation.

Figure 3:
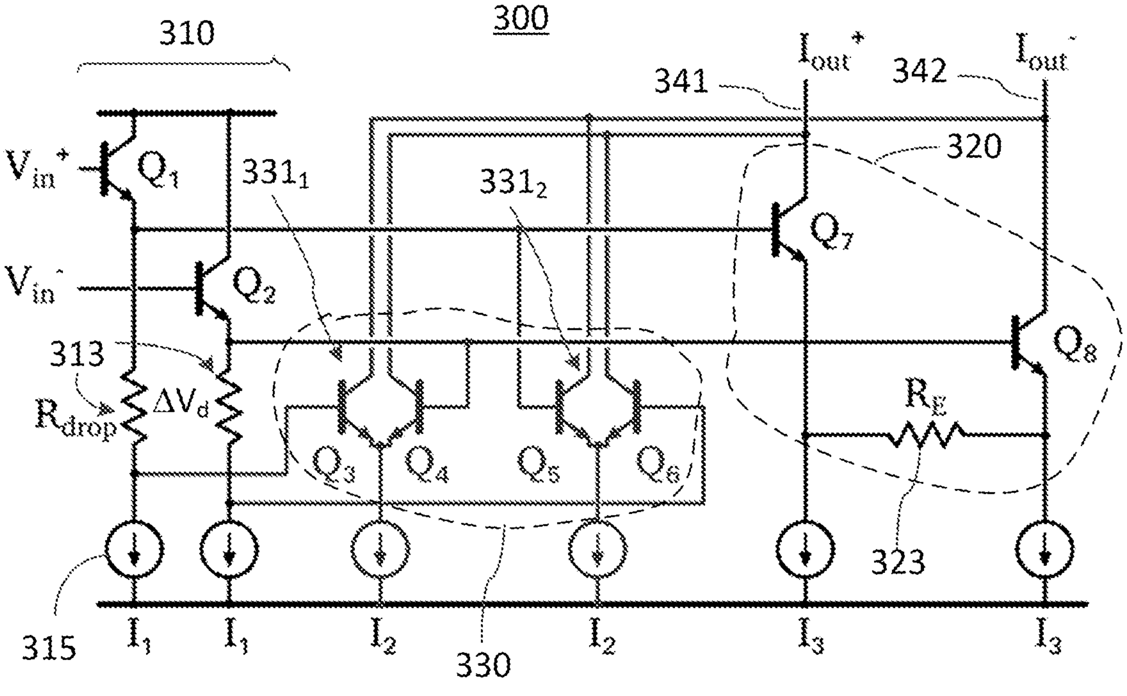
FIG. 3 shows a circuit diagram of a transconductor for the TIA circuit of FIG. 2 according to an embodiment of the present disclosure.

FIG. 3 shows an example circuit embodiment of a current limiting transconductor circuit 300 having differential outputs ("circuit 300"). The circuit of FIG. 3 may be used, e.g., as an output driver of a TIA circuit, such as the output driver 230 of the TIA 200 illustrated in FIG. 2. An emitter follower 310 (i.e., the circuit including bipolar transistors $Q_1$ and $Q_2$) drives a degenerated differential bipolar transistor pair 320 (transistors $Q_7$ and $Q_8$ with a degeneration resistor $R_E$, "first circuit 320"), as well as a limiter circuit 330. The limiter circuit 330 includes two undegenerated differential bipolar transistor pairs $\mathbf{331}_1$ (transistors $Q_3$ and $Q_4$) and $\mathbf{331}_2$ (transistors $Q_5$ and $Q_6$), which are connected to the outputs with opposite polarity of bipolar transistors $Q_7$ and $Q_8$, and act as limiters. The limiter circuit 330 is connected to subtract the currents it generates from the currents generated by the first circuit 320 in response to the input voltage $V_{in}$.

The degenerated differential transistor pair $Q_7$ and $Q_8$, i.e. the first circuit 320, may function as a linear transconductor, and the resistor $R_E$ 323 is typically set to achieve a desired linear range of input voltages. In an example embodiment, the I-V response of the first circuit 320 to variations of the input voltage $V_{in}=(V_{in+}-V_{in-})$, e.g. as illustrated by the dotted curve 403 in FIG. 4, is approximately linear in a voltage range, e.g. from $-V_1$ to $+V_1$, that somewhat exceeds a target operating range of the circuit; in the example of FIG. 4, $V_1 \cong 1.1$V.

In an embodiment, the main transconductor circuit of FIG. 3 (i.e, the first circuit 320) is an output stage of a TIA circuit, e.g. of the output driver 230 of the TIA 200 illustrated in FIG. 2, and the differential outputs 341, 342 (marked with respective output currents $I_{out}^+$ and $I_{out}^-$) of the circuit 300 of FIG. 3 are the differential outputs of the TIA circuit, e.g. TIA 200, so that the limiter circuit 330 of FIG. 3, formed with the undegenerated transistor pairs $\mathbf{331}_1$ ($Q_3/Q_4$) and $\mathbf{331}_2$ ($Q_5/Q_6$), is connected across the differential outputs 341, 342 of the circuit 300. The two sub-circuits $\mathbf{331}_1$, $\mathbf{331}_2$ of the limiter circuit 330, based on the differential transistor pairs $Q_3/Q_4$ and $Q_5/Q_6$, respectively, may be separately referred to as limiter transconductors, tanh-type current limiters, or simply as limiters. Together, these two limiter transconductors form a multi-tanh type current limiter, which may also be referred to as a multi-tanh doublet (current) limiter.

Figure 4:
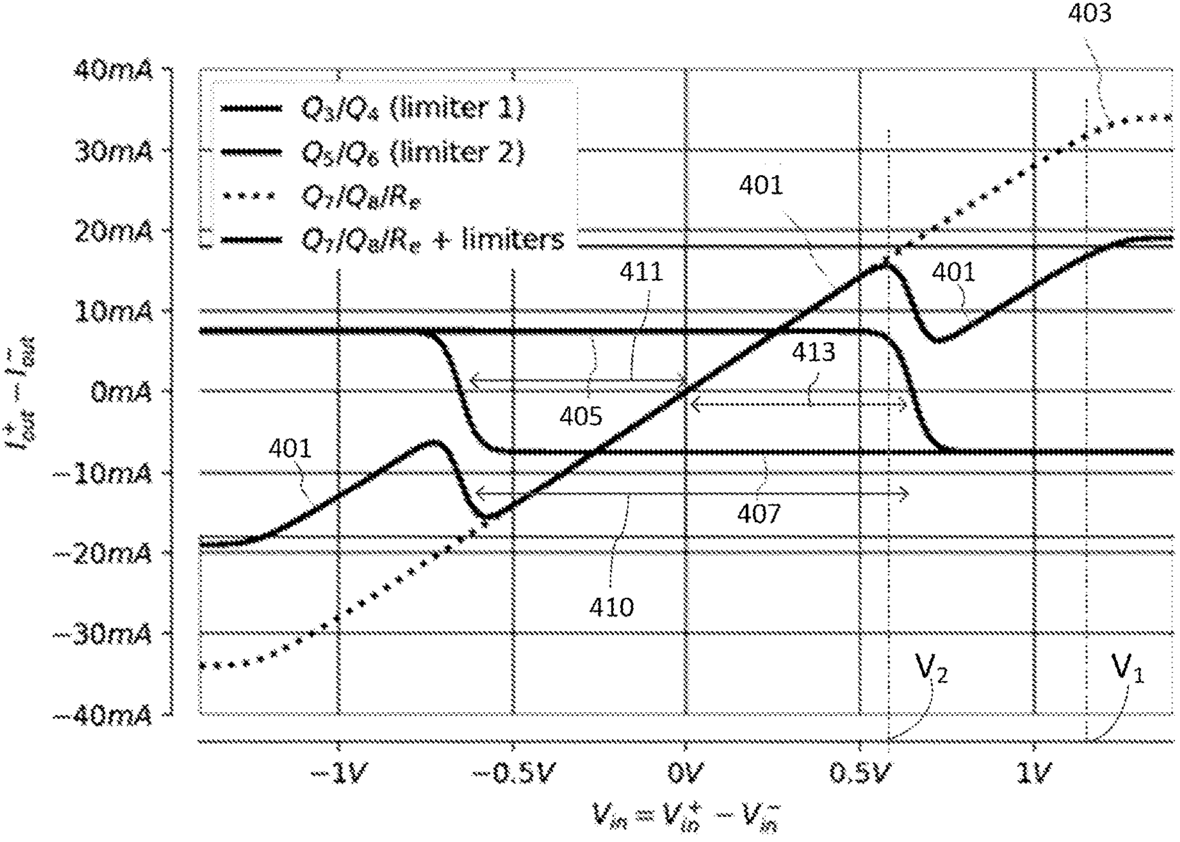
FIG. 4 is a graph illustrating output current vs input voltage characteristics for the circuit of FIG. 3.

The first and second tanh-type current limiters, $\mathbf{331}_1$ and $\mathbf{331}_2$, implemented respectively with the transistor pairs $Q_3/Q_4$ and $Q_5/Q_6$, are DC-biased to have I-V characteristics, e.g. 405 and 407 in FIG. 4, that are shifted relative to each other by a voltage offset 410, said voltage offset 410 approximately being a voltage range for linear amplification of the transimpedance amplifier. In the illustrated embodiments, the transistor pairs $Q_3/Q_4$ and $Q_5/Q_6$ are biased to have input DC voltage offsets 411, 413 (FIG. 4) of opposite signs (relative to a common-mode DC voltage, if present), which may be denoted herein as $V_{offset1}$ and $V_{offset2}$, respectively. The input DC voltage offsets $V_{offset1}$ and $V_{offset2}$ may also be referred to herein as threshold voltages for the respective tanh-type transconductors. Magnitude of each of these voltage offsets is given by a voltage drop $\Delta V_d$ across a corresponding resistor 313 (FIG. 3). In the illustrated embodiment (FIG. 3) the two resistors 313 are of equal resistance value $R_{drop}$, so that $|V_{offset\ 1}|=|V_{offset\ 2}|=\Delta V_d=R_{drop}*I_1$, however embodiments with different values of the voltage offsets 411, 413 (FIG. 4) are also within the scope of this disclosure. Here $I_1$ is the emitter current of the transistors $Q_1$ and $Q_2$.

Due to the DC offsets 411 and 413, for a small input voltage swing the differential transistor pairs $Q_3/Q_4$ or $Q_5/Q_6$ are effectively "railed"; at these voltages their transconductance (dI/dV) is close to 0. Here "railed" means that the corresponding transistor pair $\mathbf{331}_1$ ($Q_3/Q_4$) or $\mathbf{331}_2$ ($Q_5/Q_6$) operates in a saturation regime, where approximately all current $I_2$ flows through one branch of the corresponding pair $\mathbf{331}_1$ or $\mathbf{331}_2$, e.g. the transistor $Q_4$ or the transistor $Q_5$ in the circuit 300 of FIG. 3. In a typical embodiment, when the magnitude $|V_{in}|$ of the input differential voltage $V_{in}=(V_{in+}-V_{in-})$ to the circuit 300 is smaller than, e.g., about 0.8 $\Delta V_d$, the transconductance of the differential transistor pair $\mathbf{331}_1$ ($Q_3/Q_4$) or $\mathbf{331}_2$ ($Q_5/Q_6$) is much smaller, e.g. by a factor of 5, or preferably a factor of 10, than a transconductance of the first circuit 320 (the degenerated differential transistor pair $Q_7$ and $Q_8$).

When the input signal $V_{in}$ approaches one of threshold voltages $V_{offset2}=+\Delta V_d$ or $V_{offset1}=-\Delta V_d$, one of the limiter differential transistor pairs, $\mathbf{331}_1$ ($Q_3/Q_4$) or $\mathbf{331}_2$ ($Q_5/Q_6$), turns on, and subtracts current from the output, thus reducing the overall transconductance of the circuit 300 of FIG. 3. Due to the exponential turn-on behavior of undegenerated bipolar differential pairs, this effect happens rather abruptly, and typically only significantly affects the output differential signal when the magnitude of the input differential signal approaches $\Delta V_d$. As a result, the output current is clamped for $|V_{in}|>\Delta V_d$, with a low impact on the circuit linearity for $V_{in}<\Delta V_d$.

A simulated output differential current swing as a function of input differential voltage $V_{in}$ for the circuit in FIG. 3 is shown in solid black in FIG. 4. The output current (curve 401) linearly tracks the input differential voltage up to a given threshold $+\backslash-V_2\sim\Delta V_d$ (~0.6V in the illustrated example), and above the threshold (below for negative $V_{in}$) is clamped to below a given value (20 mA in the illustrated example). The I-V characteristics (output current as a function of input voltage) of the limiters $\mathbf{331}_1$ ($Q_3/Q_4$) and $331_2$ ($Q_5/Q_6$) are tanh-type functions having opposite offsets, $+\backslash-\Delta V_d$ respectively. The transconductance dI/dV of the limiters reaches its peak value in their respective transition regions, where $|V_{in}|\sim\Delta V_d$, where it is substantially greater, e.g. 2-5 times greater, in magnitude than the trans-conductance of the output stage of the circuit 300 (the first circuit 320, degenerated transistor pair $Q_7/Q_8$), with the transition being typically abrupt, and does not affect linearity significantly within the nominal linear region between about $-V_2$ and about $+V_2$.

Unlike a diode clamp, the clamping technique implemented in the circuit 300 of FIG. 3 does not typically significantly affect the circuit linearity. Also since the limiter transconductors $\mathbf{331}_1$ (transistor pair $Q_3/Q_4$) and $331_2$ (transistor pair $Q_5/Q_6$) are effectively railed during nominal operation, the current clamping technique implemented in FIG. 3 only adds a small input and output capacitance overhead.

FIG. 4 also shows the behavior of the three transconductors 320, 331$_1$, and 331$_2$, in the circuit 300 of FIG. 3. The I-V characteristic of the main degenerated transconductor 320 ($Q_7/Q_8/R_E$) of FIG. 3, ("first circuit"), shown in FIG. 4 in dashed black (curve 403), has a wide linear range, i.e. the transconductance of the main transconductor (first circuit 320, FIG. 3) is approximately constant in the range from about −1.1. V to +1.1V in this example. The output differential current ($I_{out}^{+}-I_{out}^{-}$) of the circuit of FIG. 3 saturates with a gentle transition for very large input voltage swings, greater than about 1.2 V in the illustrated example. The limiter transconductors 331$_1$ ($Q_3/Q_4$) and 331$_2$ ($Q_5/Q_6$) of FIG. 3, curves 405 and 407 respectively in FIG. 4, are effectively railed (saturated) for $V_{in}$~0 (i.e. the output differential current is about constant vs the differential input voltage $V_{in}$), and have an abrupt transition for $V_{in}$ ~±0.6V, which is the threshold set by the input DC voltage offset(s) $V_{offset1,2} \cong \Delta V_d = R_{drop}*I_1$. Note that once the limiter transconductors 331$_1$, 331$_2$ (FIG. 3) engage, the variation of the output differential current has an opposite gradient compared to the main transconductor 320 (FIG. 3), due to being connected to the output with opposite polarity, and is also much steeper (due to the absence of degeneration resistance 323 $R_E$). As a result, the output current is abruptly clamped.

The threshold voltage at which the limiter transconductors 331$_1$, 331$_2$ are turned on, e.g. $\Delta V_d$ in the embodiment of FIG. 3, is desirably set so that the output voltage swing does not exceed the required limit of the ADC reliability. Advantageously, embodiments of the present disclosure may facilitate an accurate control of the threshold voltage $\Delta V_d$. The $\Delta V_d$ is a function of the emitter followers current ($I_1$ in FIG. 3). The DC current In may be generated e.g. by a bipolar current source (e.g. 315, FIG. 3) with limited collector-emitter headroom. In high-speed amplifiers, such current sources are typically adjusted for low output capacitance rather than high current precision, which may result in a significant variation of the DC current $I_1$ across Process/Voltage/Temperature (PVT) variations, and in a low accuracy of the transconductor threshold voltages $\Delta V_d = R_{drop}*I_1$ that define the limits on the output voltage of the TIA.

Figure 5:
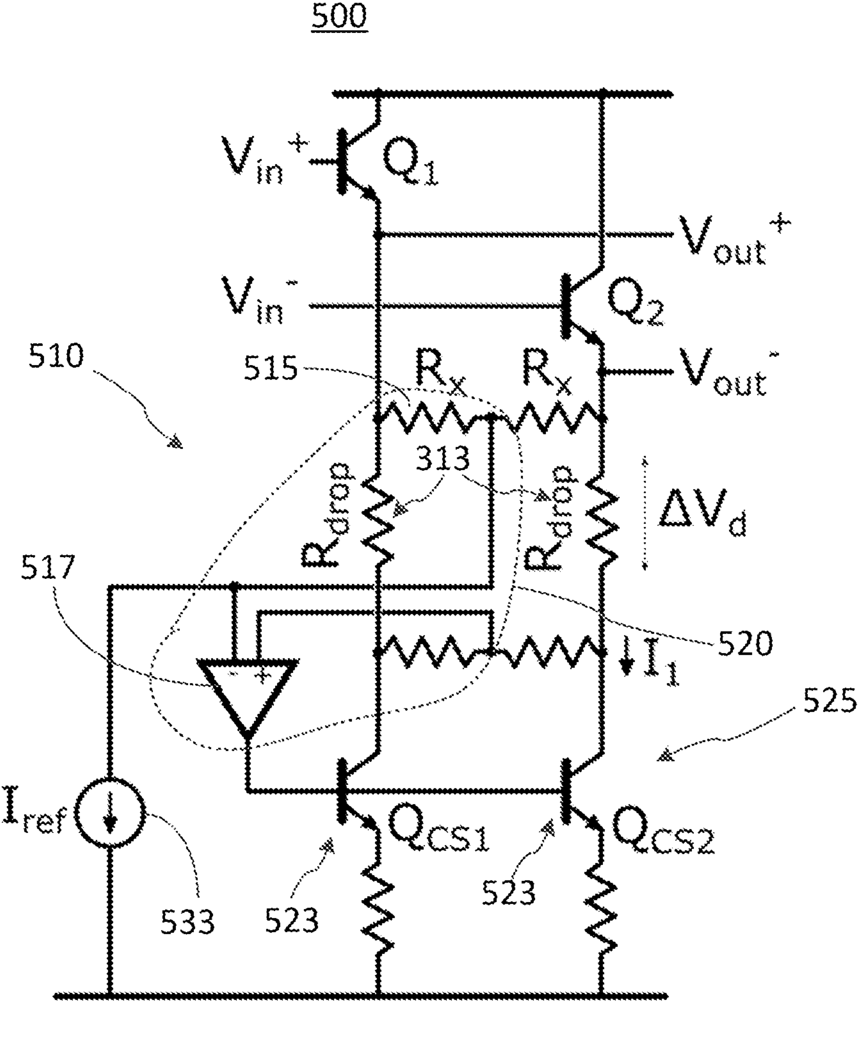
FIG. 5 is a schematic circuit diagram of an example threshold control circuit for use in an embodiment of the transconductor of FIG. 3.
Figure 5:
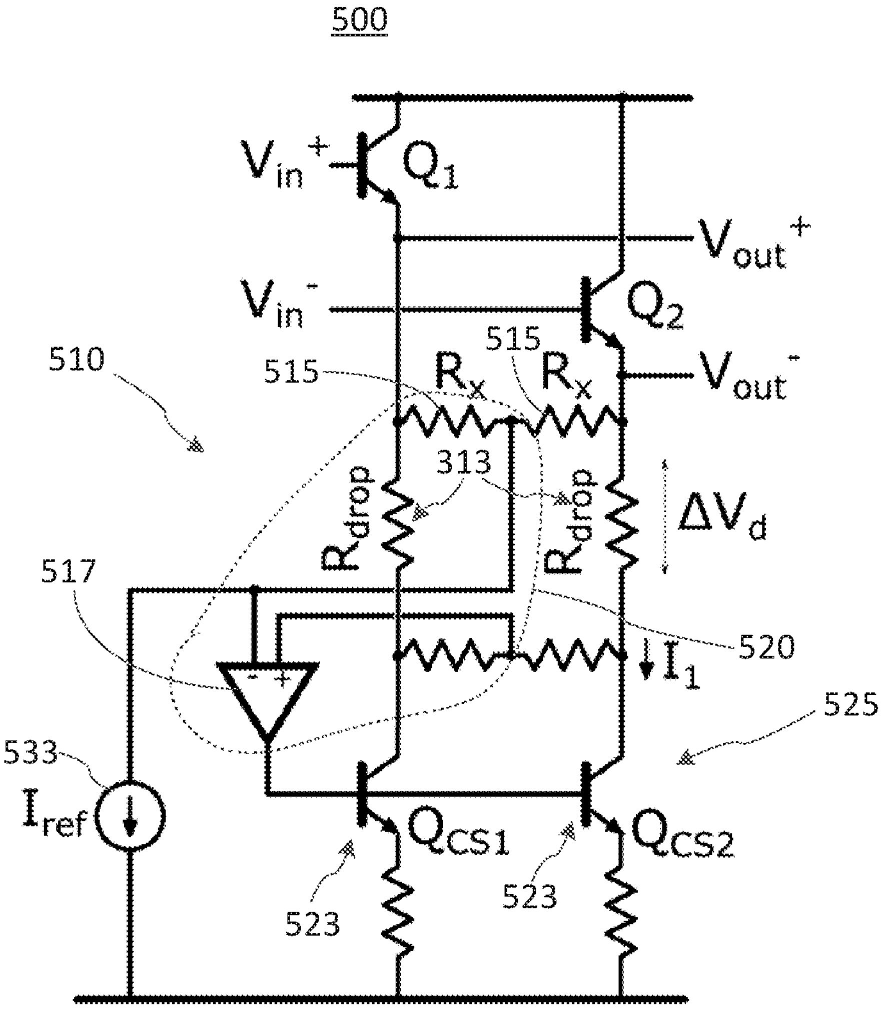

FIG. 5 shows an example embodiment of a threshold control circuit 500 that may be used in the transconductor circuit of FIG. 3 to generate the current(s) $I_1$. Inputs of the first and second tanh-type current limiters 331$_1$, 331$_2$ of the circuit 300 of FIG. 3 connect across the resistor(s) 313 $R_{drop}$, as illustrated in FIG. 3. In the circuit of FIG. 5, a first current source comprising e.g. transistors 523 $Q_{CS1}$, $Q_{CS2}$ provides a first current $I_1$ through the resistor(s) 313. The voltage drop $\Delta V_d = I_1*R_{drop}$ across the resistor(s) 313 defines an input DC voltage offset, and thereby a turn-on voltage, for the first and second tanh-type current limiters 331$_1$, 331$_2$ of FIG. 3, as described above with reference to FIG. 3. In the circuit of FIG. 5, a small current $I_{ref} \ll I_1$ from a reference current source 533 is sunk through resistors 515 having a resistance $R_x \gg R_{drop}$. The ratio $R_x/R_{drop}$ may be greater than 10, or e.g. in the range from about 15 to about 100. A closed-loop scheme using a low-offset operational amplifier 517 sets the base voltage of the first current source(s) and creates a virtual short-circuit between inputs of the operational amplifier 517, thus approximately forcing $\Delta V_d = R_x*I_{ref}$. The current $I_{ref}$ is isolated from the signal path by the resistors $R_x$ 515, therefore can be generated by a MOS current source optimized for high precision rather than low output capacitance.

Embodiments of the circuit of FIG. 3 with the threshold control circuit of FIG. 5 may facilitate an accurate control of a voltage clamping threshold at a TIA output without significantly degrading high-frequency performance of the TIA.

The example embodiments described above are not intended to be limiting, and many variations will become apparent to a skilled reader having the benefit of the present disclosure. For example, although the example embodiments illustrated in FIGS. 3 and 5 have a differential input to differential output configuration, other embodiments may have single input to differential output configuration, single input to single output (SISO) configuration, or a differential input to single output configuration. In case of a single-ended input, the same circuit as in FIG. 3 may be used, but connecting either $V_{in+}$ or $V_{in-}$ to a fixed DC voltage. Some embodiments may use field-effect transistors instead of, or in combination with, bipolar transistors. In some embodiments, resistor $R_{drop}$ and/or current $I_1$ in the embodiment of FIG. 3 may be tunable to adjust the limiter threshold. In some embodiments, offsets of the limiter transconductors may be created by introducing a geometry mismatch (e.g. emitter length for a bipolar transistor) between transistors Q3 and Q4, and between transistors Q5 and Q6. These geometry mismatches may be used instead of, or in combination with, the voltage offset $\Delta V_d$.

It will be understood by one skilled in the art that various changes in detail may be affected in the described embodiments without departing from the spirit and scope of the invention as defined by the claims.

The invention claimed is:

1. An apparatus comprising:

a transimpedance amplifier (TIA) with differential outputs; and a multi-tanh type current limiter connected across the differential outputs of the transimpedance amplifier, wherein the multi-tanh type current limiter comprises first and second tanh-type current limiters connected to subtract an output current thereof from an output current of the TIA, wherein the first and second tanh-type current limiters are biased to be shifted in voltage, and wherein the TIA includes a degenerated transistor pair at an output thereof.

2. The apparatus of claim 1, wherein the multi-tanh type current limiter comprises two non-degenerated transistor pairs.

3. The apparatus of claim 1 wherein a peak transconductance of each of the first and second tanh-type current limiters is at least double in magnitude a peak transconductance of the degenerated transistor pair.

4. The apparatus of claim 1, wherein the first and second tanh-type current limiters are biased to have threshold voltages of opposite sign, further comprising a threshold control circuit for controlling the threshold voltages.

5. The apparatus of claim 4 wherein the threshold control circuit comprises:

a first resistor $R_{drop}$ for passing a first current $I_1$ therethrough, a voltage drop $\Delta V_d = I_1*R_{drop}$ across the first resistor biasing one of the first and second tanh-type current limiters to have a threshold voltage equal to $\Delta V_d$;

a transistor for tuning the first current $I_1$;

a voltage feedback circuit comprising a second resistor $R_x \geq 10 \cdot R_{drop}$ in parallel with the first resistor; and a reference current source for flowing a reference current $I_{ref}$ through the second resistor $R_x$;

wherein the voltage feedback circuit further comprises an operational amplifier coupled to the transistor for adjusting the first current $I_1$ to force the voltage drop across the first resistor $R_{drop}$ to be equal to approximately $R_x \cdot I_{ref}$.

6. The apparatus of claim 4 wherein the threshold control circuit comprises:

a resistor $R_{drop}$ having first and second terminals connected to positive and negative inputs, respectively, of the first and second tanh-type current limiters;

a first current source comprising a transistor and connected to the second terminal of the resistor $R_{drop}$ to flow a first current $I_1$ therethrough, so that a voltage drop $\Delta V_d = I_1 * R_{drop}$ across the resistor $R_{drop}$ provides one of the threshold voltages for turning on the corresponding one of first and second tanh-type current limiters;

a resistor $R_x$ having a first terminal connected to the first terminal of $R_{drop}$, and a second terminal connected to a second current source for generating a reference current $I_{ref}$, wherein $R_x \geq 10 \cdot R_{drop}$;

an operational amplifier having an output connected to a base or gate of the transistor of the first current source, and inputs connected to the second terminals of the resistors $R_x$ and $R_{drop}$, so as to set $\Delta V_d$ approximately equal in magnitude to $I_{ref} * R_x$.

7. The apparatus of claim 1, wherein the first and second tanh-type current limiters are biased to have I-V characteristics shifted relative to each other by a voltage offset approximately being a voltage range for linear amplification by the transimpedance amplifier.

8. The apparatus of claim 1 comprising a coherent optical receiver including the TIA.

* * * * *